(12) United States Patent
Kosmowski

(10) Patent No.: US 7,638,731 B2
(45) Date of Patent: Dec. 29, 2009

(54) REAL TIME TARGET TOPOGRAPHY TRACKING DURING LASER PROCESSING

(75) Inventor: Mark Kosmowski, Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 801 days.

(21) Appl. No.: 11/253,778

(22) Filed: Oct. 18, 2005

(65) Prior Publication Data

US 2007/0084837 A1    Apr. 19, 2007

(51) Int. Cl.
*B23K 26/00*   (2006.01)
*B23K 26/02*   (2006.01)
(52) U.S. Cl. ............................. 219/121.68; 219/121.78
(58) Field of Classification Search .. 219/121.6–121.86
See application file for complete search history.

(56) References Cited

U.S. PATENT DOCUMENTS

| | | | | |
|---|---|---|---|---|
| 3,994,586 | A * | 11/1976 | Sharkins et al. ............... | 356/73 |
| 4,129,781 | A * | 12/1978 | Doyle ..................... | 250/341.3 |
| 5,594,235 | A * | 1/1997 | Lee ......................... | 250/201.3 |
| 6,249,347 | B1 * | 6/2001 | Svetkoff et al. ............ | 356/625 |
| 6,377,039 | B1 * | 4/2002 | Goldfine et al. ............ | 324/232 |
| 6,563,130 | B2 * | 5/2003 | Dworkowski et al. .. | 250/559.33 |
| 6,563,308 | B2 * | 5/2003 | Nagano et al. .............. | 324/230 |
| 6,677,553 | B2 | 1/2004 | Matsumoto et al. .... | 219/121.81 |
| 6,700,658 | B2 | 3/2004 | Leonard .................. | 356/237.1 |
| 6,720,567 | B2 | 4/2004 | Fordahl et al. ......... | 250/559.29 |
| 2002/0167581 | A1 | 11/2002 | Cordingley et al. ......... | 347/173 |
| 2002/0190435 | A1 * | 12/2002 | O'Brien et al. ............. | 264/400 |

OTHER PUBLICATIONS

Keyence brochure, *Introducing the Ultimate in Non-Contact Laser Measurement*, High-speed, High-accuracy CCD Laser Displacement Sensor LK-G Series, 18 pages (2005).
Micro-Epsilon brochure, *Sensors & Systems*, Confocal chromatic displacement sensor optoNCDT 2400, 4 pages (also includes one page Web link, http://www.micro-epsilon.com/publicweb/Content.php?id=3008—last visited Aug. 25, 2005).

* cited by examiner

*Primary Examiner*—Sang Y Paik
(74) *Attorney, Agent, or Firm*—Stoel Rives LLP

(57) ABSTRACT

An efficient method of and a system for performing topography measurement facilitates increasing laser machining throughput. Topography measurements at multiple points on a target specimen or continuous real time measurement and monitoring of the target specimen surface topography and target specimen thickness can be performed during a laser machining process. Measurement of the thickness of the target specimen to be laser machined would permit fine tuning of laser energy delivered and result in higher quality target material removal.

25 Claims, 6 Drawing Sheets

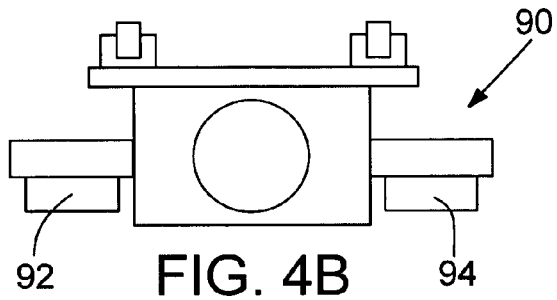
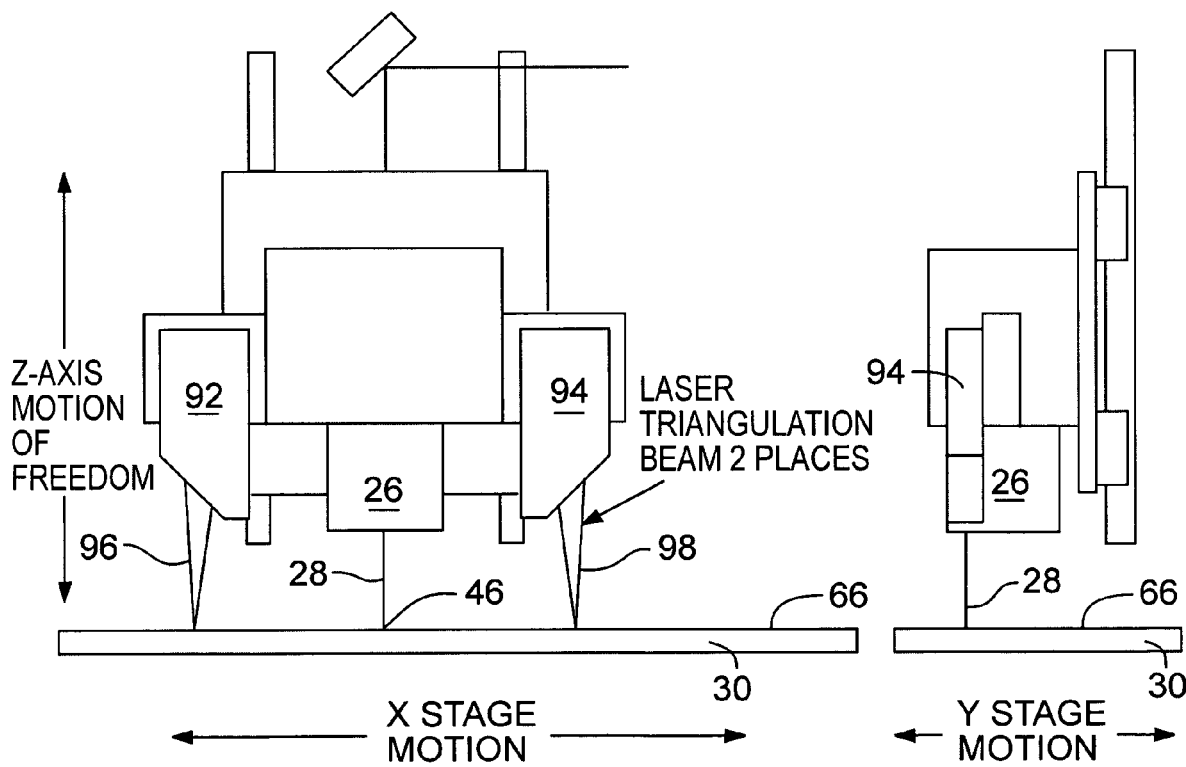
FIG. 4B
FIG. 4A
FIG. 4C

REAL TIME TARGET TOPOGRAPHY TRACKING DURING LASER PROCESSING

COPYRIGHT NOTICE

© 2005 Electro Scientific Industries, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR § 1.71 (d).

TECHNICAL FIELD

The present invention relates to laser machining target materials and, in particular, to a system and method for automatic measurement of one or both of the topography and thickness of a layer of a sequentially laminated target from which material is removed to form vias of repeatable quality at increased yield.

BACKGROUND INFORMATION

Lasers are used to drill vias in and remove material from electronic materials products. The epoxy or resin often used in dielectric layers of electrical circuit boards is among the types of material typically removed by such a laser. For a machining laser beam to reliably and consistently remove a layer of material, it is desirable that one or both of the depth of focus and image plane of the beam fall within the depth of the layer of material undergoing removal. Variations in either the thickness or the topography of the layer undergoing removal, or in the topography of other target layers, may alter the relative location of the layer with respect to one or both of the depth of focus and image plane of the beam and thereby result in inconsistently drilled and poor quality vias.

The use of a machining laser beam and beam positioning system to drill vias in a sequentially laminated target is well known in the art. Such sequentially laminated targets typically include conductive layers and dielectric layers and are used as circuit boards in electronic circuit applications.

There are four main quality metrics that characterize a via. They include the taper of the via, the roundness of the via, the smoothness of the wall, and the cleanliness of the bottom surface. When the depth of focus of the machining laser beam is outside of the layer from which material is to be removed, vias will be drilled with nonuniform diameters. The via diameter may change 10%-20% if the layer thickness varies more than the depth of focus of the machining laser beam. When the thickness of the layer requiring material removal is small, excess power imparted by the machining laser beam can result in an over-drilled via, which exhibits one or both of poor wall quality and out-of-tolerance via size. If the layer of material is thick, insufficient power can result in incomplete via formation. Via quality is thus dependent on accurate perception of the surface height and thickness of the layer from which material is to be removed.

The state of the art for measuring the topography of a sequentially laminated target entails either touching the surface of the target with a probe and measuring its displacement or focusing a camera on a portion of the surface. Lowering and raising a probe or focusing a camera consumes an industrially significant amount of time, which elapses before the actual material removal process. Because of the time associated with current methods of measurement, the height of each target is measured only at a single location. While it permits adjustment of the depth of focus of the machining beam based on variations from target to target, a single measurement does not account for variations in topography of a single target.

Although the thickness of a single layer of material may vary by only 6 microns, the height of a target surface can vary by more than 60 microns. Since some layers requiring material removal can be as thin as 25 microns, the variation in surface height of the target is more than sufficient to cause the depth of focus to fall outside of the target layer and thereby reduce the quality of any via drilled in that layer. As technology continues to demand miniaturization, vias will likely continue to shrink in diameter, depth, or both, and, therefore, be formed by lasers of shorter (e.g., UV) wavelengths. At smaller dimensions, increased quality and repeatability are even more vital to the proper functioning of vias.

Variations in the thickness of the layer from which material is to be removed may also reduce the quality of vias formed in the layer. When the thickness of the layer is unknown, excessive or insufficient amounts of energy may be applied by the machining laser beam during material removal, leading to either damage to the underlying conductive layer or an incompletely drilled via.

SUMMARY OF THE INVENTION

Embodiments of the invention use in a machining laser beam system a tracking device to measure in real time variations in one or both of the surface height and layer thickness of regions of a sequentially laminated target preparatory to laser machining material from them. The tracking device provides signals that correlate to distance changes it detects. Examples of a suitable tracking device include a laser triangulation, a capacitance or an eddy current probe, or a confocal device. Higher quality vias can be achieved by altering one or both of the relative position of the target and machining laser beam and the energy of the machining laser beam in response to measurements taken by the tracking device. The tracking device can be used in association with a machining laser beam of any shape under conditions in which the depth of focus can fall outside a specified operational tolerance.

In one embodiment implemented with a laser triangulation device, a tracking light beam reflects off of the target and is received by a laser beam position sensor. The reflected light received is then processed to provide information about the topography and thickness of the layer from which material is to be removed. Based on the information received, the machining laser beam system adjusts the position of the image column of the beam waist of a pulsed machining laser beam relative to the target along the axial distance between the objective lens and the target. The machining laser beam system also adjusts the number of laser pulses used in the material removal process. For via formation, the number of pulses corresponds to the amount of machining laser beam energy applied to form a via. For other machining applications using either or both of topography and thickness information, the number of pulses corresponds to the amount of machining laser beam energy applied to, for example, dice a semiconductor wafer, sever a semiconductor memory link, or trim resistive or other target material. Other embodiments use a capacitance or an eddy current probe or a confocal device as a tracking device to adjust the axial distance in similar manner.

Additional aspects and advantages will be apparent from the following detailed description of preferred embodiments, which proceeds with reference to the accompanying drawings.

BRIEF DESCRIPTION OF THE DRAWINGS

FIGS. 4A, 4B, and 4C depict respective front, plan, and side elevation views of an embodiment of a machining laser and laser positioning system that has been fitted with two tracking lasers and associated position sensing devices.

DETAILED DESCRIPTION OF PREFERRED EMBODIMENTS

Preferred embodiments of this invention are implemented with a machining laser beam that performs via drilling and other electronic circuit material removal processes. The machining laser beam is typically produced by a pulsed laser source in optical association with an objective lens, which focuses the laser into a beam suitable for drilling a target specimen mounted on a support structure. Typical targets include sequentially laminated boards often used as printed circuit boards in the electronics industry.

Figures 1, 2, 3:
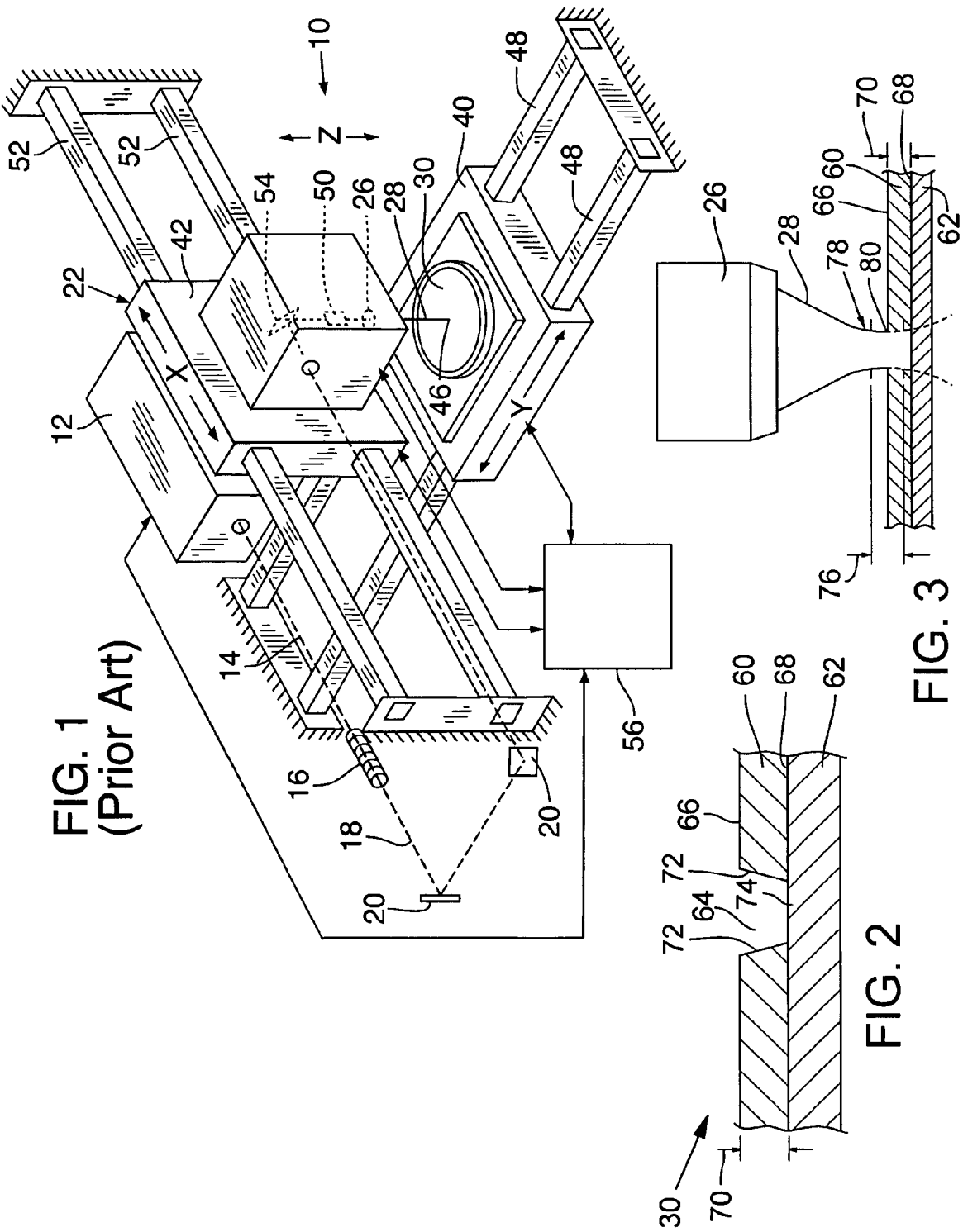
FIG. 1 shows a prior art machining laser beam system and beam positioning system configured to laser machine a target specimen.
FIG. 2 is a fragmentary cross-sectional view of a two-layer sequentially laminated target as it appears after a via has been formed by laser machining.
FIG. 3 shows the objective lens and depth of focus of the machining laser beam in relation to the target.

With reference to FIG. 1, a machining laser beam system 10 includes a laser 12 from which propagates a pulsed output beam 14 along a beam path 18. Laser output 14 may be manipulated by a variety of well-known optical devices including beam expander lens components 16 that are positioned along beam path 18 before being directed by a series of beam directing components 20 of a beam positioning system 22. Laser output beam 14 propagates through an objective lens 26, such as a focusing or telecentric scan lens, for incidence as a machining laser beam 28 on a sequentially laminated target 30 that is secured to a target specimen mount 32.

Beam positioning system 22 is used to alter the relative position of machining beam 28 and target 30 and may move one or both of machining beam 28 and mount 32. Beam positioning system 22 operates to move machining beam 28 relative to target 30 in the X-, Y-, and Z-axis directions, in which the Z axis is defined along the machining beam axis and is substantially orthogonal to the surface of target 30. The axial distance measured from the point at which machining beam 28 exits objective lens 26 and strikes the surface of target 30 is thus altered by movement of target 30 or objective lens 26 along the Z axis.

An exemplary beam positioning system 22 is described in detail in U.S. Pat. No. 5,751,585 of Cutler et al. and may include ABBE error correction described in U.S. Pat. No. 6,430,465 of Cutler, both of which patents are assigned to the assignee of this patent application. Beam positioning system 22 preferably employs a translation stage positioner that controls at least two platforms or stages 40 and 42 and supports beam directing components 20 to target and focus machining beam 28 to a desired laser target position 46. In a preferred embodiment, the translation stage positioner is a split-axis system in which a Y stage 40, typically moved by linear motors, supports and moves target 30 along rails 48, an X stage 42 supports and moves a fast positioner 50 and objective lens 26 along rails 52, the Z-axis dimension between X and Y stages 40 and 42 is adjustable, and beam directing components 20 align beam path 18 through any turns between laser 12 and a fast steering mirror 54. A typical translation stage positioner is capable of a velocity of 500 mm/sec and an acceleration of 1.5 G. For convenience, the combination of fast positioner 50 and one or more translation stages 40 and/or 42 may be referred to as a primary or integrated positioning system. An example of a preferred laser system that contains many of the above-described positioning system components is a Model 5320 laser system or others in its series manufactured by Electro Scientific Industries, Inc., the assignee of this patent application. Skilled persons will appreciate, however, that a system with a single X-Y stage for target specimen positioning and one or both of a fixed beam position and stationary galvanometer may alternatively be employed.

A laser system controller 56 preferably synchronizes the firing of laser 12 to the motion of stages 40 and 42 and fast positioner 50 in a manner well known to skilled persons. Skilled persons will appreciate that laser system controller 56 may include integrated or independent control subsystems to control and/or provide power to any or all of these laser components and that such subsystems may be remotely located with respect to laser system controller 56.

The parameters of machining beam 28 are selected to facilitate substantially clean, sequential drilling, i.e., via formation, in a wide variety of metallic, dielectric, and other target materials that may exhibit different optical absorption, material removal threshold, or other characteristics in response to UV, visible, or other appropriate wavelengths of light.

FIG. 2 depicts a cross-sectional view of a sequentially laminated target 30 of the type typically processed by machining laser beam system 10 of FIG. 1. For convenience, target 30 is depicted as having only two layers 60 and 62. Layer 62 supports layer 60, from which material is removed to form a via 64. For vias to be consistently and properly drilled, the depth of focus of machining beam 28 is established within layer 60. Thus, the depth of focus is set between a surface 66 of sequentially laminated target 30 and a surface 68 of layer 62 that is beneath layer 60. Layer 60 has a thickness 70, which is the distance between surfaces 66 and 68.

Layer 62 may contain, for example, standard metals such as aluminum, copper, gold, molybdenum, nickel, palladium, platinum, silver, titanium, tungsten, metal nitrides, or combinations thereof. A conventional metal layer 62 varies in thickness, typically between 9 μm-36 μm, but may be thinner or as thick as 72 μm. Sequential conductive layers in a single target 30 are typically made of the same material.

Dielectric matrix or layer 60 may contain, for example, a standard organic dielectric material such as benzocyclobutane, bismaleimide triazine, cardboard, cyanate esters, epoxies, phenolics, polyimides, polytetrafluorethylene, various polymer alloys, or combinations thereof. Conventional organic dielectric layers vary considerably in thickness, but are typically much thicker than metal layers such as layer 62. An exemplary thickness range for organic dielectric layers 60 is about 30 μm-400 μm.

Via diameters preferably range from 25 μm-300 μm, but laser system 10 may produce vias that have diameters as small as about 5 μm-25 μm or greater than 1 mm. Because the preferred material removal spot size of machining beam 28 is preferably about 25 μm-75 μm, vias larger than 25 μm may be produced by trepanning, concentric circle processing, or spiral processing.

Thus, with reference to FIG. 2, the quality of via 64 relates directly to the smoothness of via walls 72, the cleanliness of a via bottom 74, and the top and bottom diameters (i.e., taper) of the via.

FIG. 3 shows machining beam 28 in relation to target 30 during via drilling. An image column 76 of a focused beam waist 78 of machining beam 28 corresponds to its depth of focus and identifies a region within which the focus of machining beam 28 is sufficiently tight to consistently drill vias of a specified diameter. An image plane 80 identifies the optimum plane of focus for machining beam 28. To obtain repeatable and high-quality vias, image column 76 extends throughout layer 60. If the distance from objective lens 26 to target surface 66 and/or conductive surface 68 changes, image column 76 may fall either above or below layer 60, resulting in a lower quality via.

FIG. 4A is a front view of a machining laser beam system 90 to which are mounted similar tracking laser beam sources 92 and 94 emitting respective tracking laser beams 96 and 98 that propagate along separate beam paths near the path of machining beam 28. FIGS. 4B and 4C show respective top and side views of laser system 90 of FIG. 4A. Laser system 90 is of similar construction to that of laser system 10, except for the addition of tracking laser beam sources 92 and 94 and associated ancillary devices operating to process information carried by or derived from tracking beams 96 and 98. Components common to laser systems 10 and 90 are identified by the same reference numerals.

Beam positioning system 22 causes relative translational movement of machining beam 28 along surface 66 of target 30 and relative axial movement between objective lens 26 and target 30. Tracking beams 96 and 98 are offset by fixed, known distances from and are positioned relative to machining beam 28 so that different ones of tracking beams 96 and 98 lead machining beam 28 as it traverses the machining path in the opposite directions along the X axis. Although not shown, tracking laser beams 96 and 98 may also be configured to lead machining laser beam 28 as it travels along the Y axis.

Alternatively, if the topography of surface 66 or thickness 70 of layer 60 varies only slightly over the offset distance between machining beam 28 and a selected one of tracking beams 96 and 98, the selected tracking beam may be employed to measure the topography of surface 66 and thickness 70 of layer 60 near laser target position 46. The selected tracking beam need not lead machining beam 28, and measurements can be taken once objective lens 26 is located above laser target position 46. This is so because the selected tracking beam is sufficiently near laser target position 46 such that the measurements taken approximate the parameters relating to laser target position 46.

Figure 5:
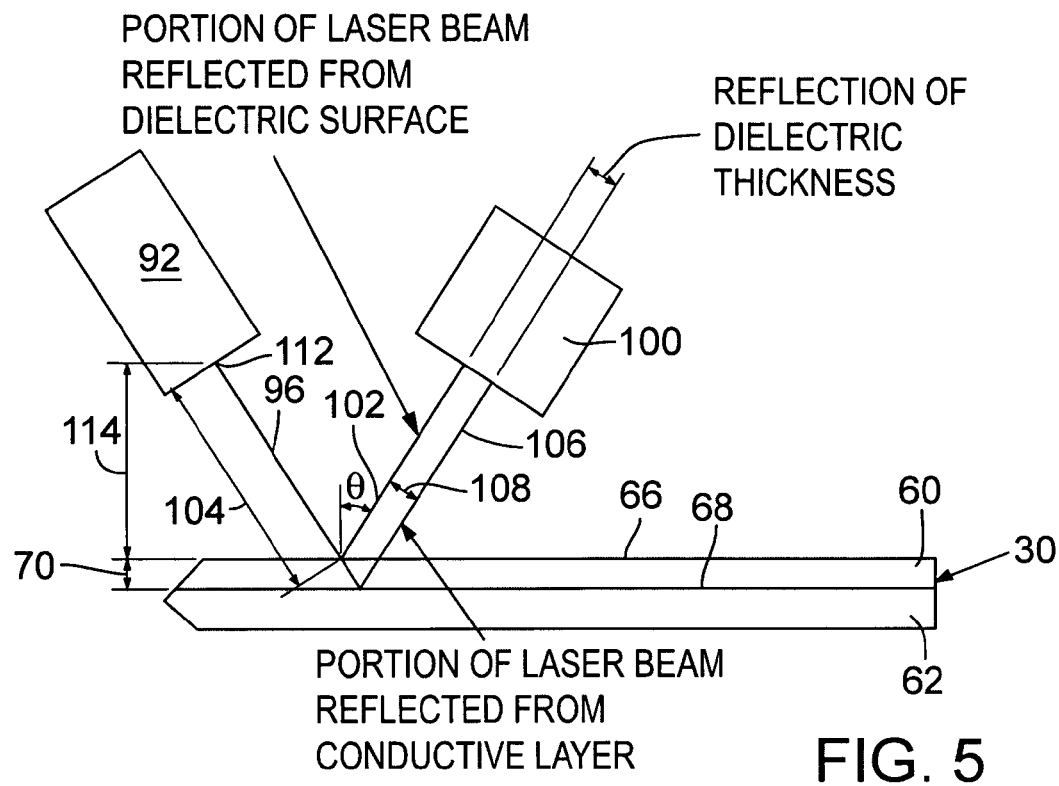
FIG. 5 is a diagram showing a tracking laser beam, laser beam position sensor, and relevant surfaces of a sequentially laminated target.

FIG. 5 shows the positional relationship of tracking beam 96 and an associated beam position sensor 100 for measuring surface topography and layer thickness of target 30. Tracking beam source 92 emits tracking laser beam 96, which is incident on and a portion of which reflects off of surface 66 of target 30 to form a first reflected light beam 102. First reflected light beam 102 is then received by beam position sensor 100. The characteristics of first reflected light beam 102, as measured by beam position sensor 100, are processed to determine an axial distance 104 measured between a known location relative to tracking laser beam 96 and surface 66 at the instantaneous location of incidence of tracking laser beam 96 on surface 66. In the embodiments described and as shown in FIG. 5, the known location is the exit surface of objective lens 26. Axial distance 104 corresponds to the height of surface 66 at the measurement location. Determining axial distance 104 continually as tracking beam 96 moves along surface 66 provides a surface typography measurement of target 30. This enables laser system controller 56 to cause corresponding movement of objective lens 28 along beam path 18 to substantially maintain the position of image column 76 on surface 66 or within layer 60.

FIG. 5 further shows the function of measuring ablation layer thickness 68. If layer 60 is at least partly transparent and the angle of incidence θ is within a specified range, a portion of tracking laser beam 96 propagates through layer 60 and reflects off surface 68 of electrically conductive layer 62 beneath to form a second reflected light beam 106. This is true, for example, of a printed circuit board in which an epoxy top layer 60 is supported on a copper layer 62. Second reflected light beam 106 is separated from first reflected light beam 104 by a displacement distance 108, which corresponds to the thickness of layer 60. Laser position sensor 100 is operable to measure and provide an output signal corresponding to displacement distance 108. Electrical signals generated by incidence of first and second reflected light beams 102 and 106 on position sensor 100 provide information about displacement distance 108, which corresponds to thickness 70 of layer 60. Laser system controller 56 can process the outputs of beam position sensor 100 to determine the actual thickness 70 of layer 60 and thereafter adjust accordingly the number of pulses of laser energy applied to layer 60 to form via 64 to compensate for variation in thickness 70. Skilled persons will appreciate that measuring one or both of target surface topography and target layer thickness entails repetitive sampling of beam position sensor 100 by laser system controller 56 as the tracking beam travels with machining beam 28 along its beam path.

Figure 6:
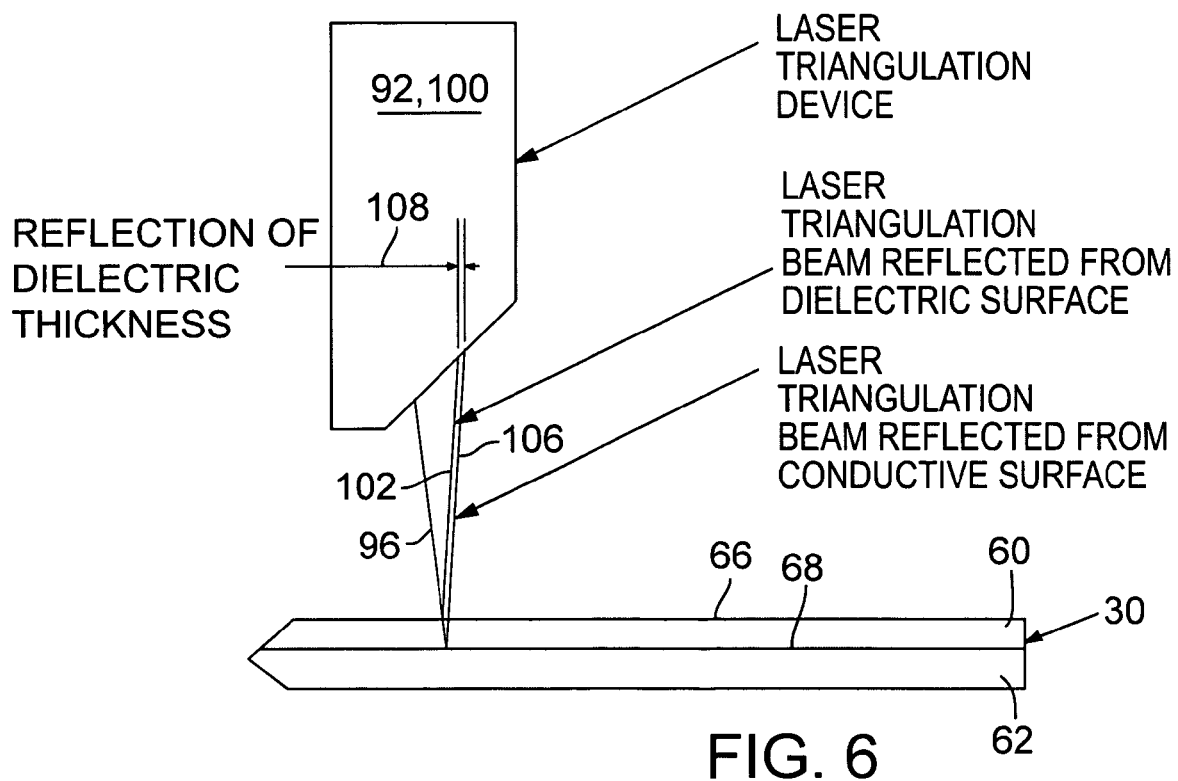
FIG. 6 is a diagram showing an alternative embodiment of the system components of FIG. 5.

FIG. 6 shows an alternative configuration to the system of FIG. 5, in which tracking laser source 92 and beam position sensor 100 are housed in the same compartment. One such commercially available laser triangulation device is a Model opto NCDT 1400, manufactured by Micro Epsilon, Koenigbacher Strasse 15 d-94496, Ortenburg, Germany.

Figure 7:
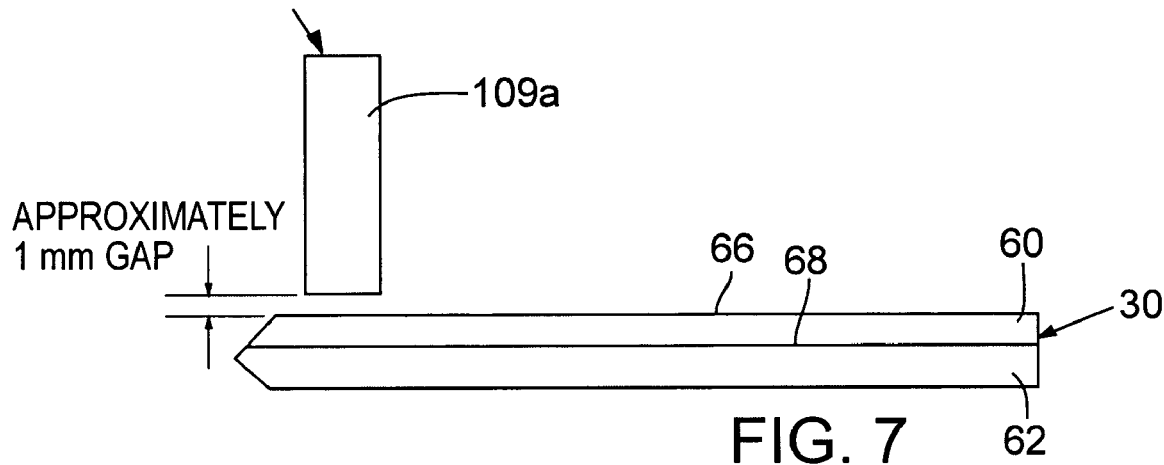
FIG. 7 shows a capacitance or an eddy current probe operating as a tracking device.

FIG. 7 shows a first alternative tracking device 109a for use in system 10, in which a capacitance probe or an eddy current probe is used to track the surface topography of conductive layer 62 of target 30 having an optically transparent dielectric layer 60. Examples of a commercially available capacitance probe and a commercially available eddy current probe are, respectively, a Model capa NCDT 620 and a Model eddy NCDT 3300, both of which are manufactured by Micro Epsilon, Koenigbacher Strasse 15 d-94496, Ortenburg, Germany.

Figure 8:
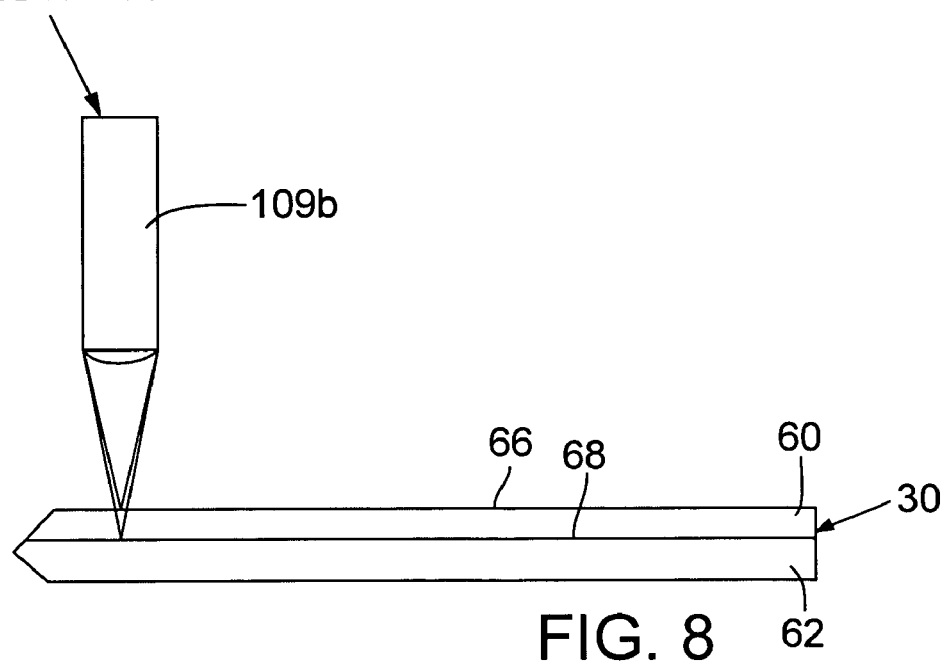
FIG. 8 shows a confocal probe operating as a tracking device.

FIG. 8 shows a first alternative tracking device 109b for use in system 10, in which a confocal device composed of a light tracking source and a feedback device is housed in the same compartment. Such a device is implemented in accordance with confocal optical principles and uses precisely located lenses to change polychromatic light into multiple monochromatic light sources that are focused at precise distances. The reflections from the monochromatic light sources are then used to determine the distance of the surface or surfaces measured. FIG. 8 shows confocal tracking device 109b tracking surfaces 66 and 68 simultaneously. One such commercially available confocal device is a Model opto NCDT 2400, manufactured by Micro Epsilon, Koenigbacher Strasse 15 d-94496, Ortenburg, Germany.

Figure 9:
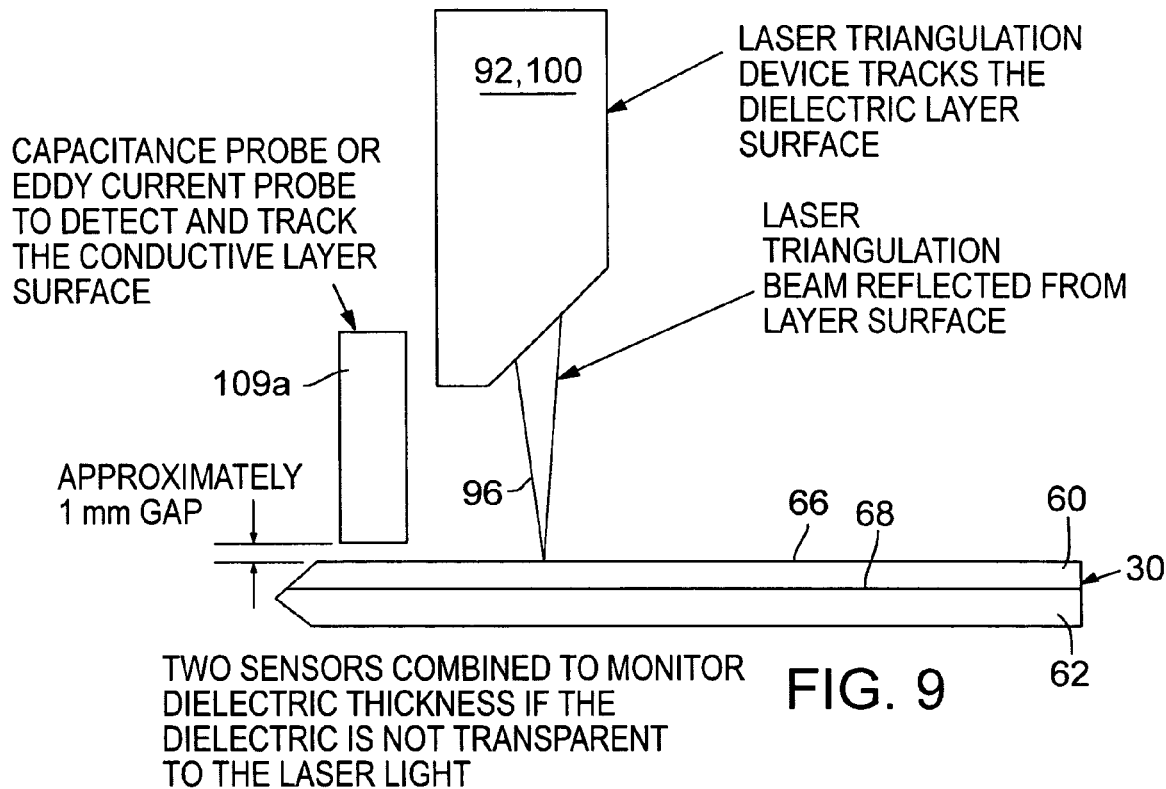
FIG. 9 shows a capacitance probe or an eddy current probe of FIG. 7 cooperating with a laser triangulation device of FIG. 6 to measure the thickness of an opaque target layer.

FIG. 9 shows the capacitance probe or eddy current probe 109a of FIG. 7 and laser triangulation device of FIG. 6 arranged in combination to monitor the thickness of dielectric layer 60 if it is not transparent to laser light. The wavelength of a beam emitted by a laser triangulation device is typically about 650 nm. Dielectric target materials suitable for laser ablation are manufactured by Ajinomoto Fine-Techno Co., Inc., Japan, and are included in the Ajinomoto Buildup Film product family. Three examples include ABF SH9K (transparent), ABF GX3 (transparent), and ABF GX13 (opaque version).

Figure 10A:
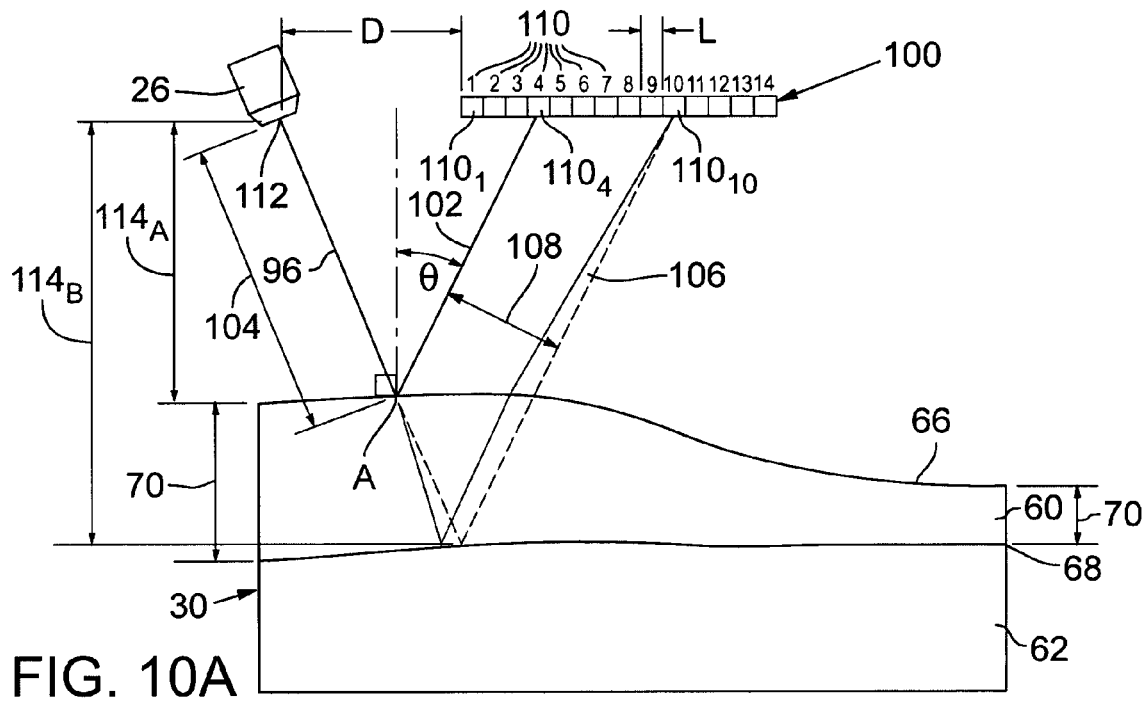
FIGS. 10A and 10B depict the positional relationships among the tracking beam, beam position sensor, and sequentially laminated target of FIG. 5 for two regions of incidence of the tracking beam on the top surface of the laminated target.
Figure 10B:
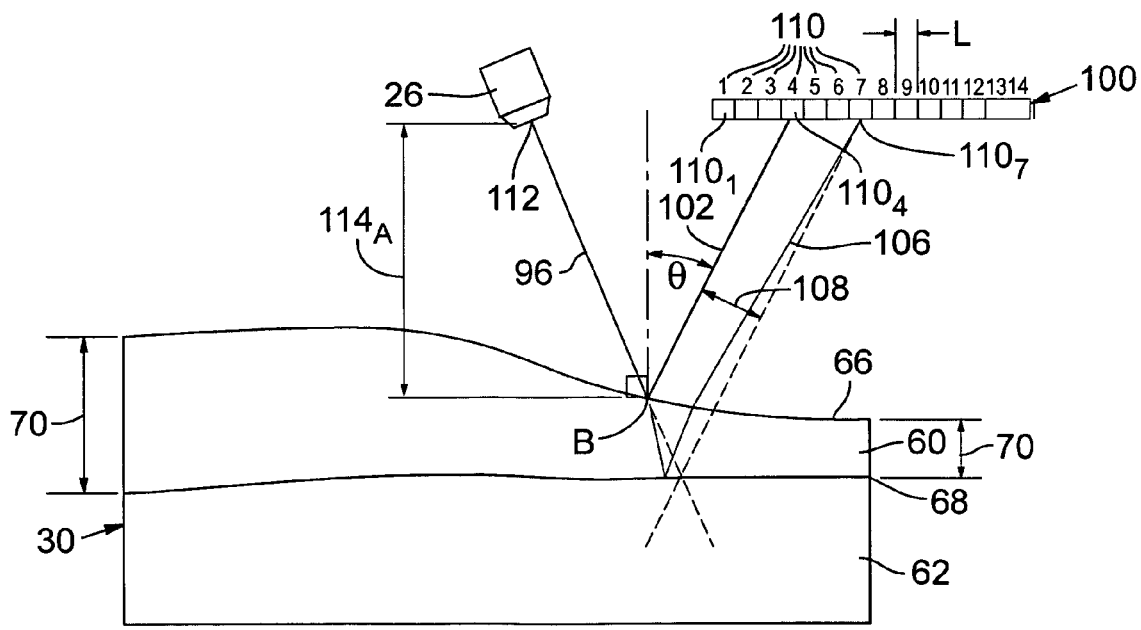

The methods of measurement of the target surface topography and thickness 70 of layer 60 are described more fully with reference to FIGS. 10A and 10B. Two operational modes corresponding to measurement of surface topography of target 30 and measurement of layer thickness 70 may be performed separately or concurrently, depending on user needs and limitations of the hardware chosen. Both operational modes entail adjusting the position of image column 76 of focused beam waist 78 relative to target 30.

In a first operational mode, tracking beam 96 is incident on surface 66 of target 30 at an angle θ with respect to a normal to surface 66. A portion of tracking beam 96 is reflected from surface 66 at a location A as first reflected light beam 102, which is received by beam position sensor 100. Beam position sensor 100 comprises a two-dimensional array of nominally identical sensor elements 110. For sake of clarity in describing the operational modes, FIGS. 10A and 10B show a one-dimensional or linear array position sensor 100 (i.e., one row of a two-dimensional array) that produces an output indicative of the sensor element 110 receiving first reflected light beam 102. A two-dimensional array position sensor 100 produces an output indicative also of the array quadrant of the sensor element 110 that receives first reflected light beam 102.

The angle θ and the fixed distance between a reference point 112 of emission from the exit surface of objective lens 26 and beam position sensor array 100 can be used, in conjunction with simple geometry, to determine for each location of incidence the distance from reference point 112 of emission to surfaces 66 and 68. For instance, if the distance from reference point 112 of emission to a first sensor element $110_1$, of beam position sensor 100 is designated D, the unit length of each sensor element 110 is L, and n is the position number of the sensor element 110 on which first reflected light beam 102 is received (counting from the sensor element 110 nearest to tracking beam 96), a distance from reference point 112 of emission to surface 66 or 68 could be determined by the expression (D+n[L])/(2[tan θ]).

FIG. 10A shows tracking beam 96 striking target 30 at a location A, where the surface height and layer thickness 70 correspond to the expected values for those variables. First reflected light beam 102 is received by a fourth sensor element $110_4$ of the beam position sensor 100, corresponding to a distance $114_A$ from reference point 112 of emission to target surface 66 at location A. FIG. 10B shows tracking beam 96 striking target 30 at a location B, where the surface height and layer thickness 70 are both decreased. Although location B is farther away from reference point 112 of emission of tracking beam 96 than is location A, laser system controller 56 responds to the output of beam position sensor 100 to cause beam positioning system 22 to move objective lens 26 downward along the Z axis so that first reflected light beam 102 travels the same distance before striking beam position sensor 100. Because beam position sensor 100 moves in concert with objective lens 26, first reflected light beam 102 is received by fourth sensor element $110_4$ corresponding to distance $114_A$ from reference point 112 of emission to target surface 66 at location B, where the surface height of target 30 is reduced relative to that at location A. The bent solid lines extending through layer 60 to beam position sensor 100 in FIGS. 10A and 10B represent the actual beam path produced by application Snell's law of refraction to light propagating through different media. (The degree of beam path bending shown is exaggerated to more clearly demonstrate the effect of refraction.)

When tracking laser beam 96 is incident on surface 66 at locations A and B, beam position sensor 100 produces output signals corresponding to the respective sensor elements $110_4$ and $110_7$ on which second reflected light beam 106 is incident. Laser system controller 56 responds to the output signals to cause beam positioning system 22 to move objective lens 26 along beam path 18 to axial distance 104 that maintains the position of image column 76 on surface 66.

In a second operational mode, laser system 90 is operable to automatically adjust the amount of energy applied by machining beam 28 based on the measured thickness 70 of layer 60 near the location to be drilled. As in the first operational mode, tracking beam 96 is produced at an angle θ and first reflected light beam 102 is received by beam position sensor 100. In the second operational mode, however, a portion of tracking beam 96 propagates through target surface 66 and reflects off of surface 68 of second layer 62, which is typically a metallic conductor. This second reflected light beam 106 is also received by the beam position sensor 100. Beam position sensor 100 receives two portions of tracking laser beam 96 as reflected by surfaces 66 and 68 of the sequentially laminated target 30.

FIG. 10A shows fourth sensor element $110_4$ and tenth sensor element $110_{10}$ receiving first and second reflected light beams 102 and 106, respectively. Distance $114_B$ is the reference datum for surface 68 of conductive layer 62 relative to reference point 112. FIG. 10B shows that, when tracking beam 96 moves over a location where thickness 70 of layer 60 of target 30 is diminished, displacement distance 108 between the first and second reflected light beams 102 and 106 is also diminished and fourth sensor element $110_4$ and seventh sensor element $110_7$, receive reflected light beams 102 and 106, respectively. The greater thickness 70 of layer 60 in FIG. 10A results in a span of six sensor elements 110 (between sensor elements $110_4$ and $110_{10}$), whereas the reduced thickness 70 in FIG. 10B results in a span of only three sensor elements 110 (between sensor elements $110_4$ and $110_7$). The span between sensor elements 110 is, therefore, directly proportional to thickness 70 of layer 60, so the output signal from the beam position sensor 100 may be processed to identify thickness 70 of layer 60 and adjust by a corresponding amount the machining beam energy applied to remove the appropriate amount of material from target 30 for the thickness measured.

Monitoring thickness 70 of dielectric layer 60 can be accomplished by filtering first reflected light beam 102 in sensor element $110_{10}$ and filtering reflected light beam 106 in sensor element $110_4$. If the double reflection implementation described above does not operate properly, it is possible to use two beam position sensors 100, one of which monitoring dielectric surface 66 and the other of which monitoring conductive surface 68. Each of sensors 100 has a filter such that one filter on a first beam position sensor 100 eliminates the dielectric reflected light beam 102 and the other filter on a second beam position sensor 100 eliminates conductive layer reflected light beam 108. Light polarizing filters would be suitable for use as the filters in detecting the difference in distance 70 between layers 66 and 68.

Figure 11:
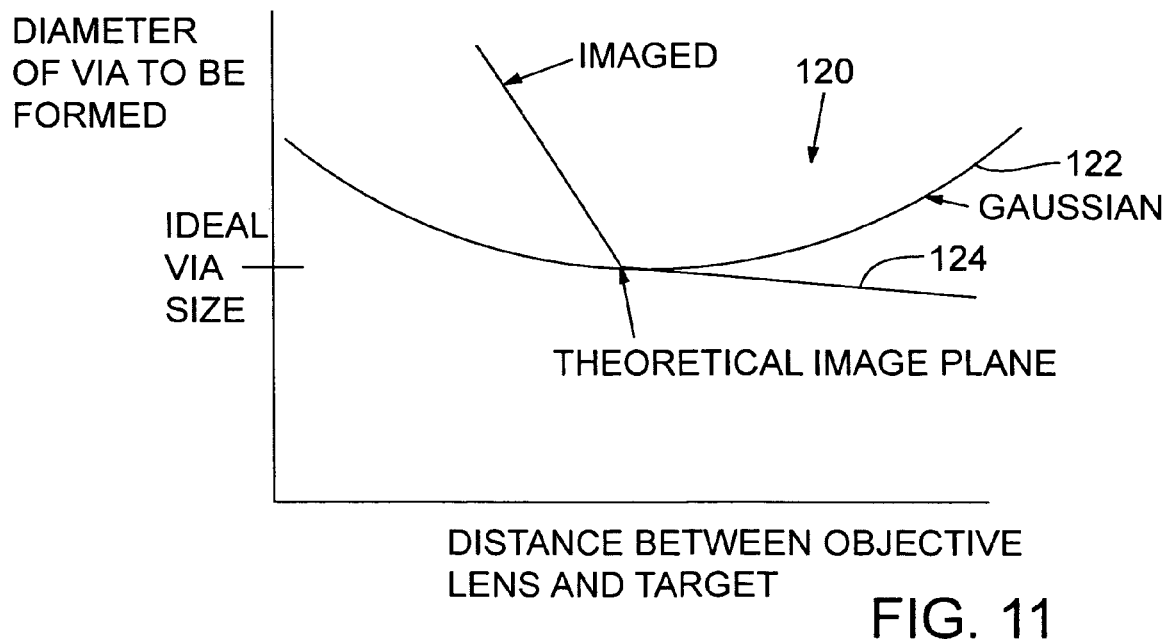
FIG. 11 is a graph showing the relationships between laser beams having different energy profiles and distances from the objective lens to a target surface.

FIG. 11 presents a graph 120 that illustrates the characteristics of a Gaussian profiled machining beam 122 and an image profiled machining beam 124 with respect to the diameter of the laser spot versus the axial distance between the target and the objective lens. Gaussian profiled machining beam 122 and image profiled machining beam 124 represent alternative shapes of energy profiles of machining laser beam 28. The theoretical image plane is the mathematical ideal distance between objective lens 26 and target surface 66. Obtaining this distance and maintaining it throughout the process is greatly desired. Deviation from the theoretical image plane is tolerable, but, as the spot size of machining laser beam 28 shrinks, the amount of allowable deviation from image plane 80 becomes so small that the variations on the topography of target 30 begins to vary the via size to the extent that drilled vias may become unacceptable from a quality standpoint. This is the reason why the equipment is designed to follow the topography of the target.

It will be obvious to those having skill in the art that many changes may be made to the details of the above-described embodiments without departing from the underlying principles of the invention. The scope of the present invention should, therefore, be determined only by the following claims.

The invention claimed is:

1. A system for laser machining a target specimen having a surface, comprising:
   a laser source and objective lens cooperating to produce a machining laser beam that has an image column and propagates along a machining beam axis for incidence on the target specimen, the objective lens and the target specimen being separated by an axial distance;
   a beam positioning system operable to change the axial distance and to move the machining laser beam and target specimen relative to each other in a direction along a machining beam path to process the target specimen at selected locations;
   a tracking device positioned in non-contacting relationship with the surface of the target specimen and in operative association with the machining laser beam to lead the machining laser beam during the relative movement in the direction along the machining beam path, the tracking device operable to repeatedly measure in real time a distance between the surface of the target specimen and the objective lens during the relative movement and produce a signal corresponding to the distance measured; and
   a laser controller cooperating with the beam positioning system and responding to the signal to set the axial distance separating the objective lens and the target specimen during the relative movement to control the position of the image column relative to the target specimen at the selected locations, and to deliver controlled amounts of energy of the machining laser beam for incidence on the target specimen at the selected locations in correspondence to the axial distance set.

2. The system of claim 1, in which the tracking device comprises a laser triangulation device.

3. The system of claim 1, in which the target specimen comprises a sequential lamination target that includes a layer of electrically conductive material and in which the tracking device comprises a capacitance probe.

4. The system of claim 1, in which the target specimen comprises a sequential lamination target that includes a layer of electrically conductive material and in which the tracking device comprises an eddy current probe.

5. The system of claim 1, in which the tracking device comprises a confocal measurement device.

6. The system of claim 1, in which the target specimen comprises a sequential lamination target that includes a layer of dielectric material positioned adjacent a layer of electrically conductive material.

7. The system of claim 6, in which the tracking device emits a tracking laser beam and the dielectric layer is at least partly transparent to the tracking laser beam and has a thickness, and further comprising a laser beam position sensor that receives a portion of the tracking laser beam propagating through the dielectric layer and reflected by the electrically conductive layer to provide an indication of the thickness of the dielectric layer.

8. The system of claim 7, in which the machining laser beam is in the form of a stream of machining laser pulses and in which the laser controller causes delivery for incidence on the dielectric layer at each of the selected locations a number of machining laser pulses that are based on a determination of the thickness of the dielectric layer at the selected location.

9. The system of claim 1, in which the tracking device emits a tracking laser beam and includes a laser beam position sensor, the target specimen comprises a sequential lamination target that includes an upper layer that is at least partly transparent to the tracking laser beam, and a portion of the tracking laser beam reflects off of the upper layer for incidence on the laser beam position sensor to produce the signal.

10. The system of claim 1, in which the tracking device emits a tracking laser beam, and further comprising a laser beam position sensor, the axial distance determined by the displacement of reflection of the tracking laser beam from a projected path, as measured by the laser beam position sensor.

11. The system of claim 1, in which the target specimen includes a layer of material that has a thickness and into which a via is to be formed, the machining laser beam is in the form of a stream of machining laser pulses, and the tracking device and the laser controller cooperate to deliver to the target specimen a number of machining laser pulses that are based on a determination of the thickness of the layer to form the via.

12. The system of claim 1, in which the machining laser beam is in the form of a stream of machining laser pulses and in which the laser controller causes delivery to the target specimen a number of machining laser pulses that are based on the repeated measurements by the tracking device.

13. The system of claim 1, in which the relative movement takes place in either a forward or a reverse direction along the machining beam path, and in which the tracking device constitutes a first tracking device, and further comprising a second tracking device positioned in non-contacting relationship with the surface of the target specimen, the first and second tracking devices operatively associated with the laser machining beam such that different ones of them lead the laser machining beam in the forward and reverse directions along the machining beam path.

14. The system of claim 1, in which:

the target specimen comprises a sequential lamination target that includes a first layer of optically nontransparent material positioned adjacent a second layer of electrically conductive material, the first layer having a first surface and being separated by a first axial distance from the objective lens, and the second layer having a second surface and being separated by a second axial distance from the objective lens; and the tracking device constitutes a first tracking device that comprises a laser triangulation device, and further comprising a second tracking device that comprises either a capacitance probe or an eddy current probe, the first and second tracking devices measuring, respectively, the first and second axial distances during the relative movement between the machining beam and the target specimen.

15. A method of accomplishing quality control of vias formed by a machining laser beam produced by a system for forming vias in a sequential lamination target having upper dielectric and electrically conductive surfaces, the system including a laser source and a laser beam positioning mechanism, the laser source emitting a laser beam propagating along a beam axis through an objective lens to produce the machining laser beam, the machining laser beam having a focused beam column, the laser beam positioning system imparting relative motion to the sequential lamination target and the machining laser beam to enable it to remove target material and thereby form vias at selected locations of the sequential lamination target, and the objective lens being positionable relative to the sequential lamination target to establish an axial distance in a direction along the beam axis to position the focused beam column of the machining laser beam on or within the sequential lamination target, comprising:

directing a tracking laser beam for incidence on the sequential lamination target to track the terrain of the upper dielectric surface, the tracking laser beam incident on the sequential lamination target separating into first and second beam portions reflecting off the dielectric surface and the electrically conductive surface, the first and second beam portions being spatially separated by a separation distance corresponding to the thickness of the dielectric surface;

positioning a beam position sensor to receive the first and second beam portions and produce a signal indicative of the separation distance;

setting the axial distance between the objective lens and the sequential lamination target in response to the signal to maintain in real time the focused beam column of the machining beam on or within the thickness of the dielectric layer; and delivering controlled amounts of energy of the machining laser beam for incidence on the sequential lamination target at the selected locations in correspondence to the axial distance set, thereby to control variations in the vias being formed.

16. A method of laser machining a target specimen having a target surface, the system including a laser source and a laser beam positioning mechanism, the laser source emitting a laser beam propagating along a beam axis through an objective lens to produce the machining laser beam, the machining laser beam having a focused beam column, the laser beam positioning system imparting relative motion to the target specimen and the machining laser beam to enable it to remove target material at selected locations of the target specimen, and the objective lens being positionable relative to the target specimen to establish an axial distance in a direction along the beam axis to position the focused beam column of the machining laser beam on or within the target specimen, comprising:

positioning a tracking device in non-contacting relationship with the target surface of the target specimen to track the terrain of the target surface, the tracking device repeatedly measuring in real time a distance between the target surface and the objective lens during the relative motion to produce a signal corresponding to the distance measured;

setting the axial distance between the objective lens and the target specimen in response to the signal to maintain in real time the focused beam column of the machining beam on or within the target specimen; and delivering controlled amounts of energy of the machining laser beam for incidence on the target specimen at the selected locations in correspondence to the axial distance set, thereby to control variations in the removal of target material at the selected locations.

17. The system of claim 16, in which the tracking device comprises a laser triangulation device.

18. The system of claim 16, in which the target specimen comprises a sequential lamination target that includes a layer of electrically conductive material and in which the tracking device comprises a capacitance probe.

19. The system of claim 16, in which the target specimen comprises a sequential lamination target that includes a layer of electrically conductive material and in which the tracking device comprises an eddy current probe.

20. The system of claim 16, in which the tracking device comprises a confocal measurement device.

21. The method of claim 16, in which the tracking device emits a tracking laser beam and in which the target specimen comprises a sequential lamination target that includes a first layer of material positioned adjacent a second layer of material, the first layer having a thickness and being transparent to the tracking laser beam, and the second layer reflecting of the tracking laser beam, and further comprising:

causing the tracking laser beam to propagate through the first layer for reflection by the second layer;

providing a laser beam position sensor that receives a portion of the tracking laser beam propagating through the first layer and reflected by the second layer to provide an indication of the thickness of the first layer;

producing as the machining laser beam a stream of machining laser pulses to establish the controlled amounts of energy of the machining laser beam; and delivering for incidence on the target specimen at each of the selected locations a number of the machining laser pulses that are based on a determination of the thickness of the first layer at the selected location.

22. The method of claim 21, in which the first layer comprises a dielectric material.

23. The method of claim 21, in which the second layer comprises an electrically conductive material.

24. The method of claim 16, in which the tracking device emits a tracking laser beam and in which the target specimen comprises a sequential lamination target that includes a top layer of material that is partly transparent to and partly reflects the tracking laser beam, and further comprising:

directing the tracking laser beam for incidence on and partial reflection by the top layer; and providing a laser beam position sensor that receives a portion of the tracking laser beam partly reflected by the top layer to produce the signal corresponding to the distance measured.

25. The method of claim 24, in which the top layer comprises a dielectric material.

* * * * *